United States Patent
Jung

(10) Patent No.: US 10,048,873 B2
(45) Date of Patent: Aug. 14, 2018

(54) MEMORY SYSTEM FOR ACCESSING MEMORY DIES DURING PROGRAM OPERATIONS AND OPERATION METHOD THEREOF

(71) Applicant: SK hynix Inc., Gyeonggi-do (KR)

(72) Inventor: Seok-Hoon Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/404,332

(22) Filed: Jan. 12, 2017

(65) Prior Publication Data

US 2017/0357447 A1 Dec. 14, 2017

(30) Foreign Application Priority Data

Jun. 10, 2016 (KR) ........................ 10-2016-0072394

(51) Int. Cl.
| | | |
|---|---|---|
| G06F 3/06 | (2006.01) | |
| G11C 16/10 | (2006.01) | |
| G06F 12/02 | (2006.01) | |
| G11C 16/26 | (2006.01) | |
| G11C 16/34 | (2006.01) | |
| G11C 16/04 | (2006.01) | |
| G11C 16/32 | (2006.01) | |

(52) U.S. Cl.
CPC ............ *G06F 3/061* (2013.01); *G06F 3/0616* (2013.01); *G06F 3/0652* (2013.01); *G06F 3/0659* (2013.01); *G06F 3/0673* (2013.01); *G06F 12/0253* (2013.01); *G11C 16/10* (2013.01); *G11C 16/26* (2013.01); *G11C 16/349* (2013.01); *G06F 2212/1016* (2013.01); *G06F 2212/1036* (2013.01); *G11C 16/0483* (2013.01); *G11C 16/32* (2013.01); *G11C 2216/22* (2013.01)

(58) Field of Classification Search
CPC .... G06F 3/061; G06F 3/0616; G06F 12/0253; G06F 3/0673; G06F 3/0659; G06F 3/0652; G06F 2212/1016; G06F 2212/1036; G11C 16/26; G11C 16/0483; G11C 16/349; G11C 16/10
See application file for complete search history.

(56) References Cited

U.S. PATENT DOCUMENTS

| | | | |
|---|---|---|---|
| 9,256,528 B2 | 2/2016 | Seo et al. | |
| 2008/0250202 A1 | 10/2008 | Conley et al. | |
| 2016/0253091 A1* | 9/2016 | Ayyavu | ................... G06F 3/061 711/103 |
| 2017/0123682 A1* | 5/2017 | Sinclair | ................. G06F 3/0611 |
| 2017/0123726 A1* | 5/2017 | Sinclair | ................. G06F 3/0659 |

\* cited by examiner

*Primary Examiner* — Pho M Luu
*Assistant Examiner* — Jerome Leboeuf
(74) *Attorney, Agent, or Firm* — IP & T Group LLP

(57) ABSTRACT

An operation method for a memory system may include: an accessing a plurality of memory devices, each including a plurality of dies, in an interleaving manner, and performing program operations; and performing at least one internal read operation to read data from the plurality of dies accessed in the interleaving manner, during the program operations, wherein one or more internal read operations which are performed during any one program operation of the program operations are determined according to a maximum internal read operation number and a minimum internal read operation waiting number.

18 Claims, 12 Drawing Sheets

FIG. 7

| CH n | WAY n | INTERNAL READ OPERATION WAITING NUMBER | | | |
|---|---|---|---|---|---|
| | | FIRST SECTION | SECOND SECTION | THIRD SECTION | FOURTH SECTION |
| 1 | 1 | 18 | 13 | 11 | 0 |
| | 2 | 24 | 19 | 17 | 6 |
| | 3 | 7 | 2 | 0 | 0 |
| | 4 | 5 | 0 | 0 | 0 |
| 2 | 1 | 50 | 35 | 32 | 30 |
| | 2 | 18 | 3 | 0 | 0 |
| | 3 | 20 | 5 | 2 | 0 |
| | 4 | 40 | 25 | 22 | 20 |
| 3 | 1 | 45 | 30 | 15 | 0 |
| | 2 | 45 | 30 | 15 | 0 |
| | 3 | 45 | 30 | 15 | 0 |
| | 4 | 45 | 30 | 15 | 0 |
| 4 | 1 | 0 | 0 | 0 | 0 |
| | 2 | 0 | 0 | 0 | 0 |
| | 3 | 0 | 0 | 0 | 0 |
| | 4 | 0 | 0 | 0 | 0 |

MEMORY SYSTEM FOR ACCESSING MEMORY DIES DURING PROGRAM OPERATIONS AND OPERATION METHOD THEREOF

CROSS-REFERENCE TO RELATED APPLICATIONS

The present application claims priority to Korean Patent Application No. 10-2016-0072394, filed on Jun. 10, 2016, which is herein incorporated by reference in its entirety.

BACKGROUND

1. Field

Exemplary embodiments of the present invention relate to a memory system, and more particularly, to a data processing operation of a memory system.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having memory devices, that is, a data storage device. The memory system may be used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments are directed to a memory system capable of maximizing the channel utilization efficiency of the memory system, and an operating method thereof.

In an embodiment, an operating method for a memory system may include: accessing a plurality of memory devices, each including a plurality of dies, in an interleaving manner, and performing program operations; and performing at least one internal read operation to read data from the plurality of dies accessed in the interleaving manner, during the program operations, wherein one or more internal read operations which are performed during any one program operation of the program operations are determined according to a maximum internal read operation number and a minimum internal read operation waiting number.

The operation method may further include: before the one or more internal read operations are performed during the one program operation, whether waiting internal read operations exist is determined through an internal read operation waiting list, and when it is determined that the waiting internal read operations exist, the program operation and the internal read operation may be performed in the interleaving manner.

The plurality of memory devices or the plurality of dies included in each of the memory devices may be coupled to a plurality of ways, coupled to one channel or a plurality of channels.

The internal read operation may include a background operation, and the background operation may include one of a garbage collection operation and a wear leveling operation.

The minimum internal read operation waiting number may indicate a minimum number of internal read operations which can be performed, in an internal read operation waiting list including the number of waiting internal read operations which can be performed by the plurality of memory devices or the plurality of dies.

The internal read operation waiting number included in the internal read operation waiting list may be determined according to an internal read operation performance time.

The maximum internal read operation number may indicate a maximum number of internal read operations which can be performed during any one of the program operations.

The one or more internal read operations which are performed during any one of the program operations may be determined through an operation of comparing the magnitude between the maximum internal read operation number and the minimum internal read operation waiting number.

In the comparing of the magnitude between the maximum internal read operation number and the minimum internal read operation waiting number, when the minimum internal read operation waiting number is less than the maximum internal read operation number, then as many internal read operations as the minimum internal read operation waiting number may be performed during the program operation.

The comparing of the magnitude between the maximum internal read operation number and the minimum internal read operation waiting number, when the minimum internal read operation waiting number is greater than the maximum internal read operation number, then as many internal read operations as the maximum internal read operation number may be performed during the program operation.

In an embodiment, a memory system may include: a plurality of memory devices, each including a plurality of dies; and a controller suitable for accessing the plurality of memory devices in an interleaving manner, performing data input operations or data output operations corresponding to the respective memory devices, and performing at least one internal read operation to read data from the plurality of dies accessed in the interleaving manner, during the program operations. The controller may determine the number of one or more internal read operations which are performed during any one program operation of the program operations according to a maximum internal read operation number and a minimum internal read operation waiting number.

Before the one or more internal read operations are performed during the one program operation, the controller may determine whether or not waiting internal read operations exist by using an internal read operation waiting list, and may perform the program operation and the internal read operation in the plurality of memory devices according to the interleaving manner, when it is determined that the waiting internal read operations exist.

The controller may be coupled to the plurality of memory devices or the plurality of dies included in each of the memory devices through a plurality of ways coupled to one channel or a plurality of channels.

The internal read operation may include a background operation, and the background operation may include one of a garbage collection operation and a wear leveling operation.

The controller may determine the minimum internal read operation waiting number indicating a minimum number of internal read operations which can be performed, in the internal read operation waiting list including the numbers of waiting internal read operations which can be performed in the plurality of memory devices or the plurality of dies.

The controller may determine the internal read operation waiting number included in the internal read operation waiting list, based on an internal read operation performance time.

The maximum internal read operation number may indicate a maximum number of internal read operations which can be performed during any one of the program operations.

The one or more internal read operations which are performed during any one of the program operations may include comparing the magnitude between the maximum internal read operation number and the minimum internal read operation waiting number.

When the minimum internal read operation waiting number is less than the maximum internal read operation number according to the result of the checking of the magnitude relationship between minimum and maximum internal read operation numbers, the controller may perform as many internal read operations as the minimum internal read operation waiting number during the program operation.

When the minimum internal read operation waiting number is greater than the maximum internal read operation number as the result of the comparing of the magnitude between minimum and maximum internal read operation numbers, the controller may perform as many internal read operations as the maximum internal read operation number during the program operation.

BRIEF DESCRIPTION OF THE DRAWINGS

Various embodiments of the present invention will be described in reference to the accompanying drawings, wherein.

FIG. 7 is a table illustrating a background operation waiting list in accordance with an embodiment;

DETAILED DESCRIPTION

Figure 1:
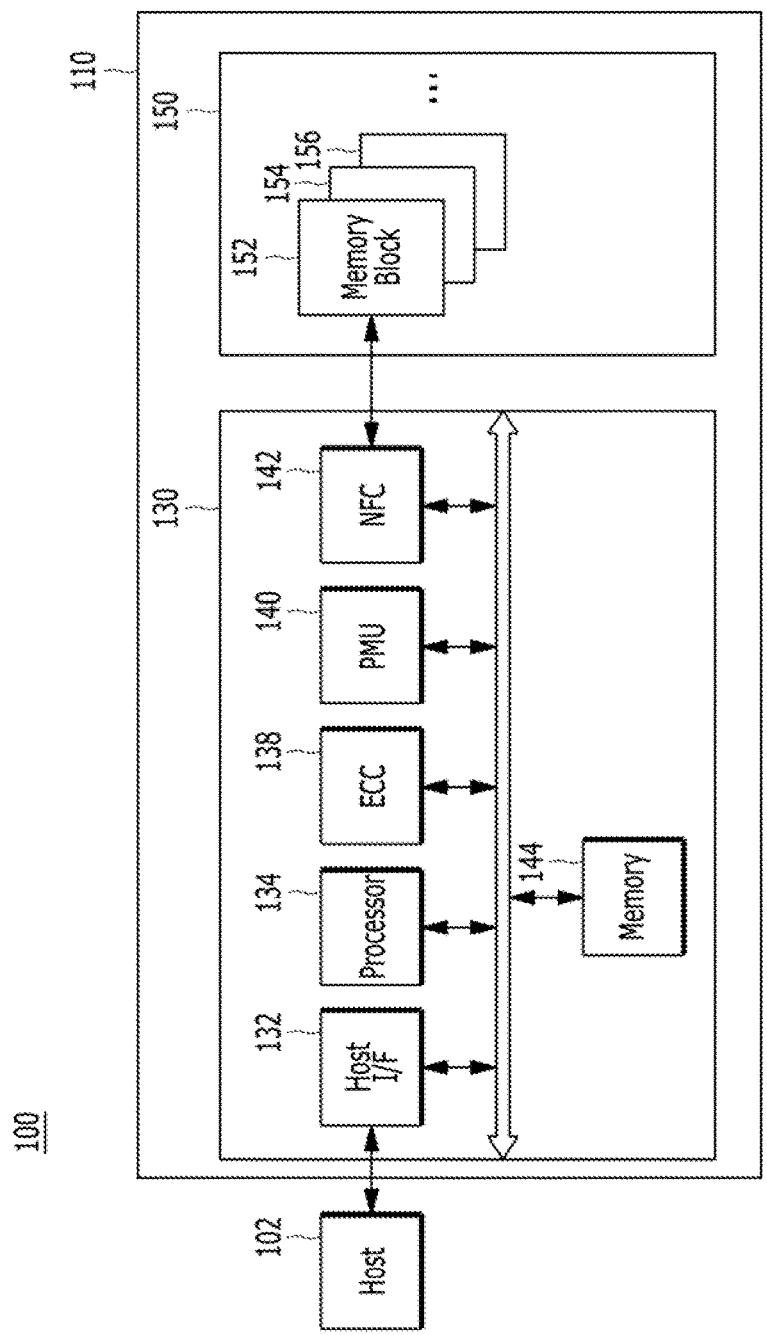
FIG. 1 is a diagram illustrating a data processing system including a memory system, according to an embodiment of the present invention.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Unless otherwise defined, all terms including technical and scientific terms used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention may have diverse modifications and embodiments, and herein, some of the embodiments are taken as examples to describe the concept and scope of the present invention. However, it is obvious to those skilled in the art that the embodiments do not limit the concept and scope of the present invention. Also, the constituent elements of the embodiments of the present invention should be understood to include all modifications, substitutes and equivalents. In this respect, the following embodiments shown in FIGS. 1 to 10 which are used to describe the principle of the present invention should be construed not to be restrictive but to be illustrative.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth to provide a thorough understanding of the present invention. The present invention may be practiced without some or all of these specific details. In other instances, well-known process structures and/or processes have not been described in more detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in more detail with reference to the attached drawings.

FIG. 1 illustrates a data processing system 100 including a memory system 110, according to an embodiment of the present invention.

Referring to FIG. 1, a data processing system 100 may include a host 102 operatively coupled to a memory system 110.

The host 102 may include, for example, a portable electronic device such as a mobile phone, an MP3 player and a laptop computer or a non-portable electronic device such as a desktop computer, a game player, a TV and a projector.

The memory system 110 may operate in response to a request received from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

The memory system 110 may include a memory device 150 for storing data to be accessed by the host 102, and a controller 130 operatively coupled to the memory device 150 for controlling the storage of data in the memory device 150 and the transfer of stored data from the memory device to the host.

The controller 130 and the memory device 150 may be integrated into a single semiconductor device. For instance, the controller 130 and the memory device 150 may be integrated into a single semiconductor device configured as a solid state drive (SSD). When the memory system 110 is used as the SSD, the operation speed of the host 102 that is electrically coupled with the memory system 110 may be significantly increased.

The controller 130 and the memory device 150 may be integrated into a single semiconductor device configured as a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted and, in particular, store the data provided from the host 102 during a write operation, and provide stored data to the host 102 during a read operation. The memory device 150 may include a plurality of memory blocks, for example, memory blocks 152, 154 and 156. Each of the memory blocks 152, 154 and 156 may include a plurality of pages. Each of the pages may include a plurality of memory cells coupled to a word line (WL). The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later.

The controller 130 of the memory system 110 may control the memory device 150 in response to a request from the host 102. For example, upon receiving a read request from the host 102 the controller 130 may issue a read command and an address to the memory device for reading the data which are stored in the requested address in the memory device and may provide the data read from the memory device 150, to the host 102. Also, in response to a program request (also referred to as a write request) received from the host 102, the controller 130 may issue a write command, an address and write data and may control the operation of the memory device for storing the write data into the memory device 150. The write data are provided from the host 102 to the memory controller together with the write request. To this end, the controller 130 may control one or more operations of the memory device 150 including, for example, a read operation, a write operation and an erase operation. The controller 130 may also control one or more background operations of the memory device 150.

In the illustrated embodiment of FIG. 1, the controller 130 includes a host interface unit 132, a processor 134, an error correction code (ECC) unit 138, a power management unit (PMU) 140, a NAND flash controller (NFC) 142, and a memory 144.

The host interface unit 132 provides an interface between the host and the controller 130. For example, the host interface 132 may receive and process requests, addresses and data provided from the host 102. The host interface may also transmit read data from the memory device to the host. The host interface 132 may communicate with the host 102 through at least one of various well-known interface protocols such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 includes a flash memory and, in particular, when the memory device 150 includes a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read operation, write operation, program operation and erase operation.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
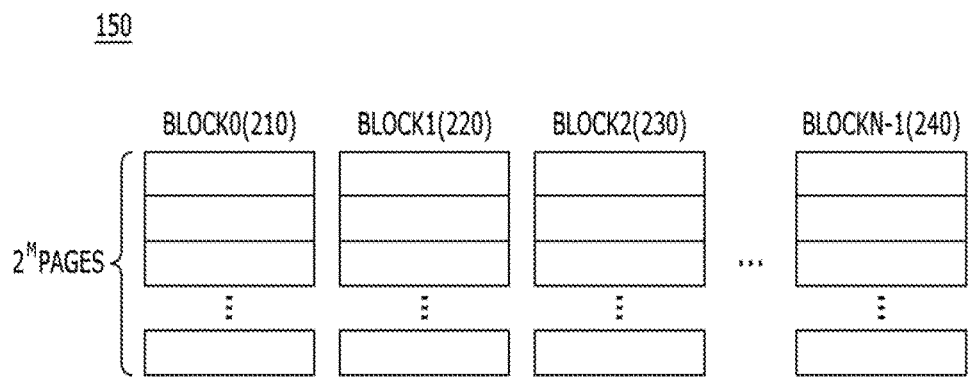
FIG. 2 is a diagram illustrating a memory device in the memory system of FIG. 1.

FIG. 2 is a schematic diagram illustrating the memory device 150 of FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. The MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
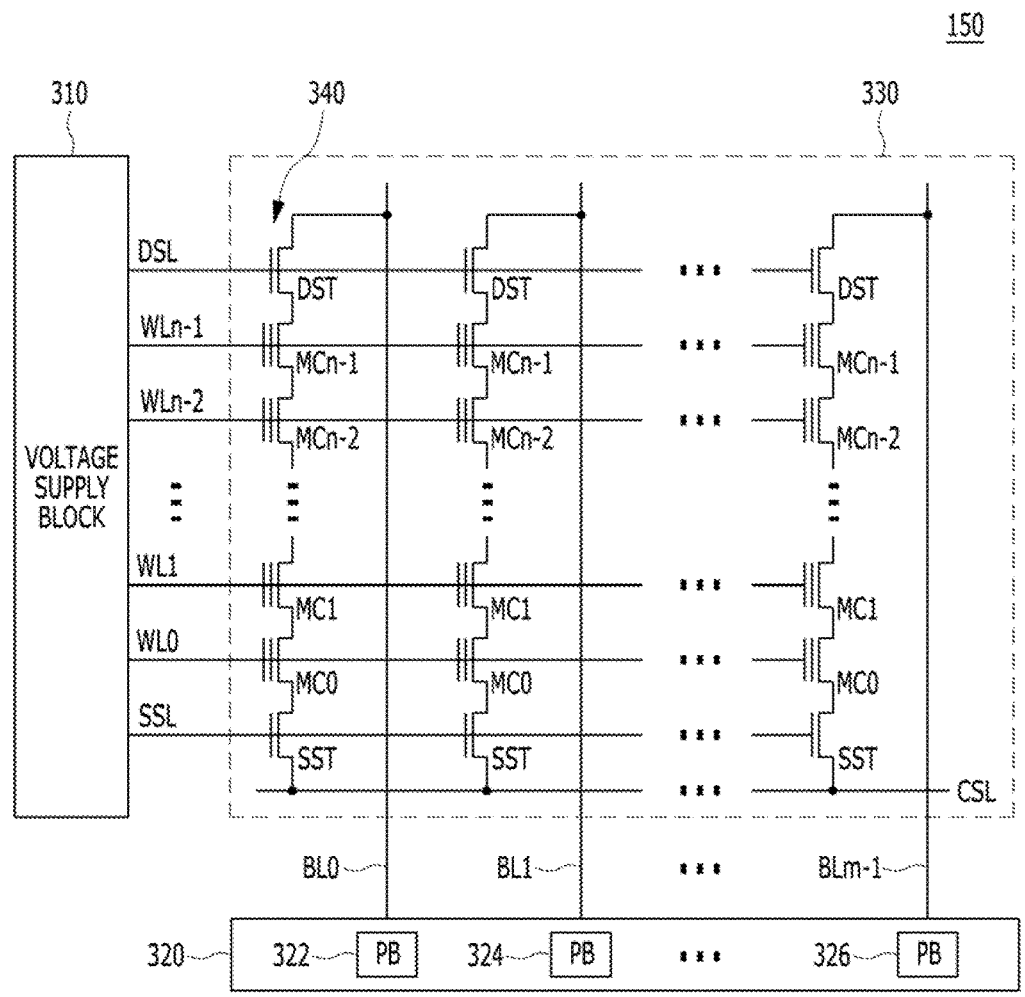
FIG. 3 is a diagram illustrating the memory cell array circuit of a memory block in a memory device in accordance with an embodiment.

FIG. 3 is a circuit diagram illustrating an example of a memory block in a memory device.

Referring to FIG. 3, a memory block 330 of a memory device 300 may include a plurality of cell strings 340 which are realized into a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors DST and SST. The respective memory cells MC0 to MCn−1 may be constructed by multi-level cells (MLC) each of which stores a data Information of a plurality of bits. The cell strings 340 may be electrically coupled to corresponding bit lines BL0 to BLm−1, respectively. For reference, in FIG. 3, 'DSL' may denote a drain select line, 'SSL' may denote a source select line, and 'CSL' may denote a common source line.

While FIG. 3 shows, as an example, the memory block 330 which is constructed by NAND flash memory cells, it is to be noted that the memory block 330 of the memory device 300 according to the embodiment is not limited to a NAND flash memory and may be realized by a NOR flash memory, a hybrid flash memory in which at least two kinds of memory cells are combined or a one-NAND flash memory in which a controller is built in a memory chip. The operational characteristics of a semiconductor device may be applied to not only a flash memory device in which a charge storing layer is constructed by conductive floating gates but also a charge trap flash (CTF) in which a charge storing layer is constructed by a dielectric layer.

A voltage supply block 310 of the memory device 300 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply block 310 may be performed by the control of a control circuit (not shown). The voltage supply block 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 300 is controlled by the control circuit, and may operate as a sense amplifier or a write driver according to an operation mode. For example, in the case of a verify/normal read operation, the read/write circuit 320 may operate as a sense amplifier for reading data from the memory cell array. Also, in the case of a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326.

Figure 4:
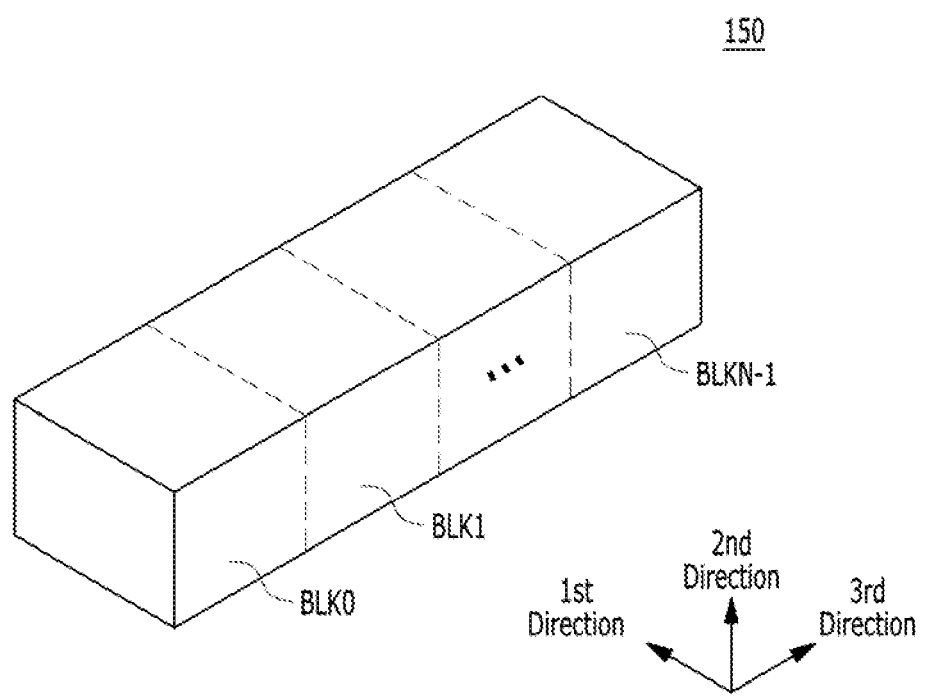
FIG. 4 is a diagram illustrating the structure of the memory device in the memory system in accordance with the embodiment.

Also, the memory device 150 may be realized as a 2-dimensional or 3-dimensional memory device. As shown in FIG. 4, in the case where the memory device 150 is realized as a 3-dimensional nonvolatile memory device, the memory device 150 may include a plurality of memory blocks BLK0 to BLKN−1.

FIG. 4 is a block diagram illustrating the memory blocks of the memory device shown in FIG. 2, and the memory blocks BLK0 to BLKN−1 may be realized as a 3-dimensional structure (or a vertical structure). For example, the respective memory blocks BLK0 to BLKN−1 may be realized as a 3-dimensional structure by including a structure which extends in first to third directions, for example, the x-axis direction, the y-axis direction and the z-axis direction.

The respective memory blocks BLK0 to BLKN−1 included in the memory device 150 may include a plurality of NAND strings which extend in the second direction. The plurality of NAND strings may be provided in the first direction and the third direction. Each NAND string may be coupled to a bit line, at least one string select line, at least one ground select line, a plurality of word lines, at least one dummy word line and a common source line, and may include a plurality of transistor structures.

Namely, among the plurality of memory blocks BLK0 to BLKN−1 of the memory device 150, the respective memory blocks BLK0 to BLKN−1 may be coupled to a plurality of bit lines, a plurality of string select lines, a plurality of ground select lines, a plurality of word lines, a plurality of dummy word lines and a plurality of common source lines, and accordingly, may include a plurality of NAND strings. Also, in the respective memory blocks BLK0 to BLKN−1, a plurality of NAND strings may be coupled to one bit line, and a plurality of transistors may be realized in one NAND string. A string select transistor of each NAND string may be coupled to a corresponding bit line, and a ground select transistor of each NAND string may be coupled to the common source line. Memory cells may be provided between the string select transistor and the ground select transistor of each NAND string. Namely, in the plurality of memory blocks BLK0 to BLKN−1 of the memory device 150, a plurality of memory cells may be realized in each of the memory blocks BLK0 to BLKN−1.

Figure 5:
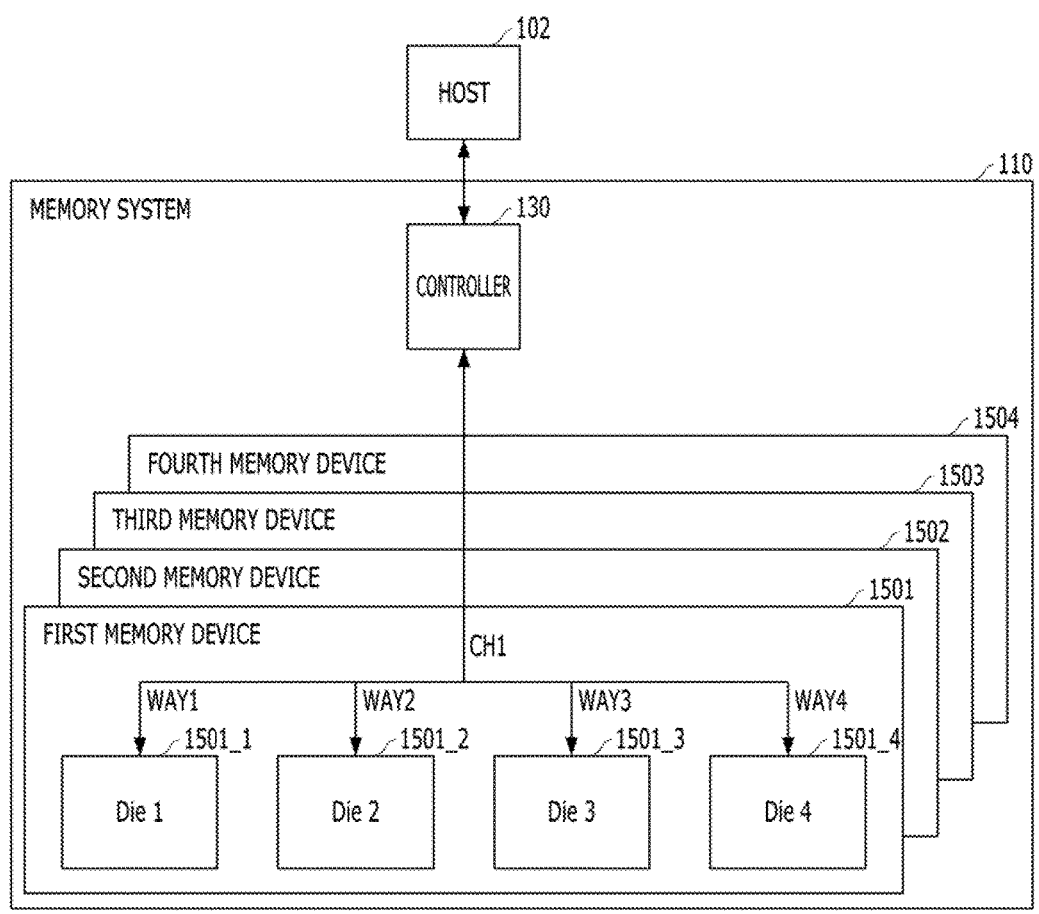
FIG. 5 is a diagram illustrating a data processing operation to a memory device in a memory system in accordance with an embodiment.

FIG. 5 is a diagram illustrating an example of a data processing operation to a memory device in a memory system 110 in accordance with an embodiment.

Referring to FIG. 5, the memory system 110 may include a plurality of memory devices 1501 to 1504, with reference to the configuration of the memory system 110 of FIG. 1. For example, the plurality of memory devices 1501 to 1504 may include a first memory device 1501, a second memory device 1502, a third memory device 1503 and a fourth memory device 1504. However, this is only an example, and more memory devices may be included in the plurality of memory devices.

Although FIG. 1 illustrates that the host interface unit 132, the processor 134, the Error Correction Code (ECC) unit 138, the Power Management Unit (PMU) 140, the NAND Flash Controller (NFC) (or memory interface) 142 and the memory 144 are included in the controller 130, FIG. 5 illustrates that the respective units are not included in the controller 130. In reality, however, the respective units are only omitted for convenience of description, and are included in the controller 130.

Referring again to FIG. 5, the memory system 110 may include the controller 130, the first memory device 1501, the second memory device 1502, the third memory device 1503 and the fourth memory device 1504. Each of the first to fourth memory devices 1501 to 1504 may include a plurality of dies. For example, the plurality of dies may include first to fourth dies 1501_1 to 1501_4 (Die1 to Die4). Each of the dies may include a plurality of planes (not illustrated).

The plurality of memory devices 1501 to 1504 may be coupled to the memory interface or NFC 142 of FIG. 1 through the corresponding channels, and coupled to an internal bus of the controller 130. For example, the first memory device 1501 may be coupled to a first channel CH1 through a plurality of ways. For example, the plurality of ways may include a first way WAY1, a second way WAY2, a third way WAY3 and a fourth way WAY4. That is, the first die (Die1) 1501_1 of the first memory device 1501 may be coupled to the memory interface 142 through the first way WAY1 of the first channel CH1, and thus coupled to the internal bus of the controller 130. The second die (Die2) 1501_2 of the first memory device 1501 may be coupled to the memory interface 142 through the second way WAY2 of the first channel CH1, and thus coupled to the internal bus of the controller 130. The third die (Die3) 1501_3 of the first memory device 1501 may be coupled to the memory interface 142 through the third way WAY3 of the first channel CH1, and thus coupled to the bus of the controller 130. The fourth die (Die4) 1501_4 of the first memory device 1501 may be coupled to the memory interface 142 through the fourth way WAY4 of the first channel CH1, and thus coupled to the bus of the controller 130. For reference, FIG. 5 illustrates that the first memory device 1501 includes four dies (Die1 to Die4) 1501_1 to 1501_4. However, this is only an example, and more dies than four dies or one die may be included in the memory device according to a designer's selection. The configuration in which the first to fourth dies Die1 to Die4 of the first memory device 1501 are coupled to the channel CH1 through the first to fourth ways WAY1 to WAY4 is only an example, and can be modified in various manners according to a designer's selection. For example, the controller 130 may be coupled to the plurality of memory devices through a plurality of channels, and perform data output operations and data input operations at the respective channels according to the interleaving method. The data output operation refers to an operation of transmitting data stored in a buffer of the memory device to a buffer memory of the controller 130. The data output operation may be performed at a data output period tDout. The data input operation refers to an operation of transmitting data stored in a buffer memory of the controller 130 to the buffer of the memory device. The data input operation may be performed at a data input period tDin.

As evident from the configuration of the first memory device 1501, the first memory device 1501 may perform an interleaving operation on a die or plane basis when an independent operation can be performed.

The independent operation may include a read operation and a program operation. The read operation refers to an operation of reading data from the memory device and storing the read data in the buffer of the memory device. The read operation may include an internal read operation including a background operation. The read operation may be performed during a read period tRead. The program operation refers to an operation of programming the data stored in the buffer of the memory device to a block of the memory device, which is in an erased state. Therefore, the program operation may be started after the data input period is ended. The program operation may be performed during a program period tProgram.

Although not illustrated in FIG. 5, each of the second to fourth memory devices 1502 to 1504 may include a plurality of dies, and the plurality of dies included in each of the second to fourth memory devices 1502 to 1503 may be coupled to the corresponding channel for example, CH1 through the first to fourth ways WAY1 to WAY4. Since the second to fourth memory devices 1502 to 1504 include the same elements as the first memory device 1501, the detailed descriptions thereof are omitted herein. Hereafter, for convenience of description, the first memory device 1501 will be taken as an example.

Figure 6:
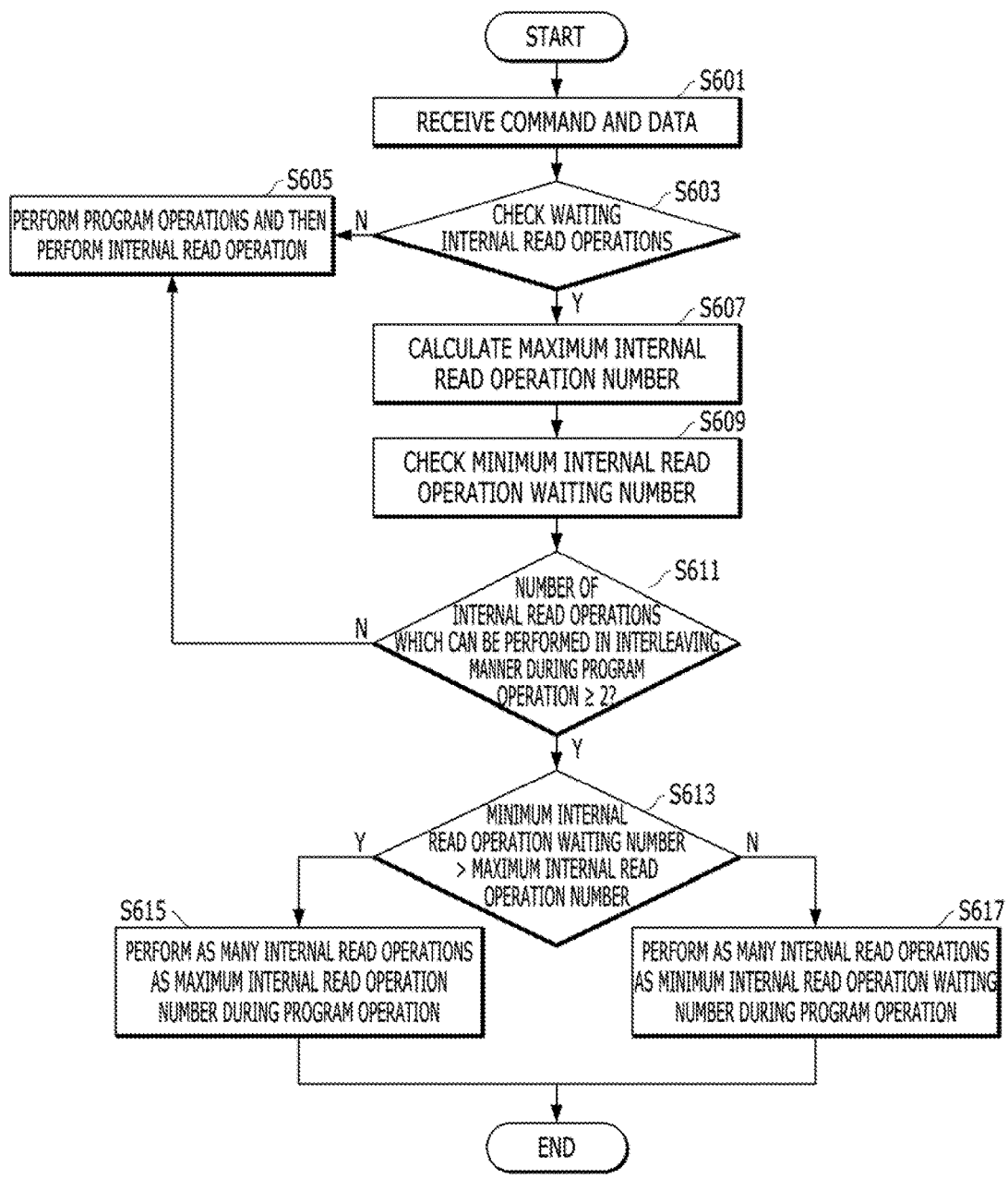
FIG. 6 is a flowchart illustrating the operation of the memory system in accordance with an embodiment.
Figure 8:
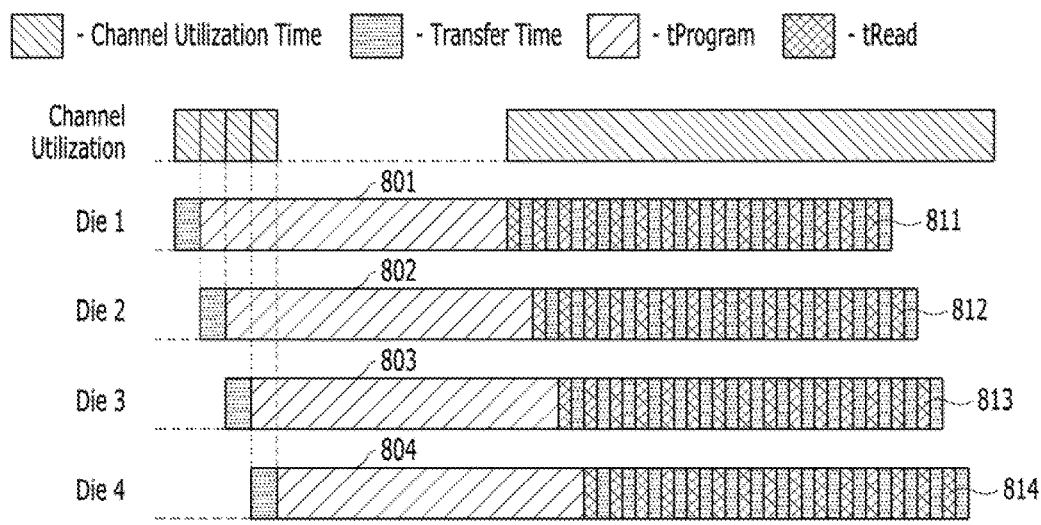
FIGS. 8 to 10 are diagrams illustrating examples of the operation of the memory system in accordance with an embodiment.
Figure 9:
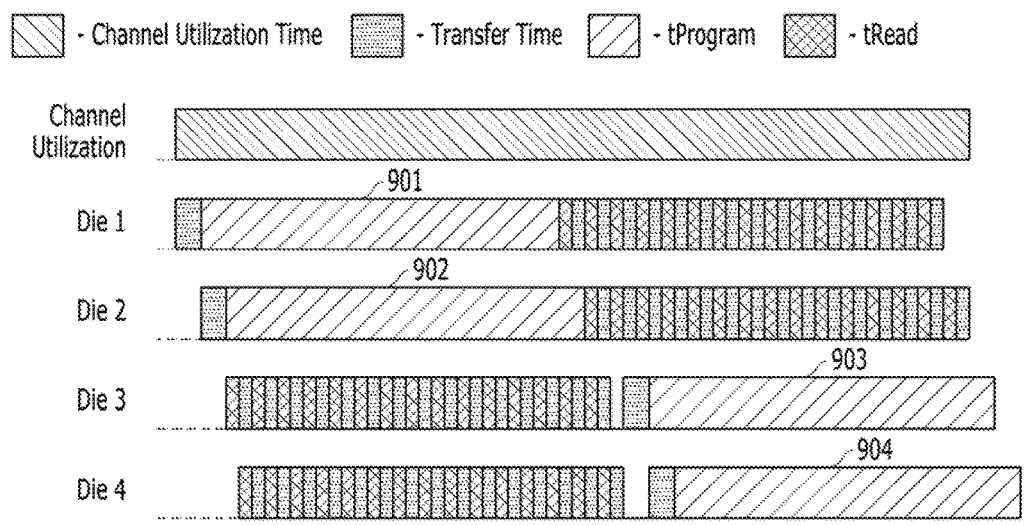
Figure 10:
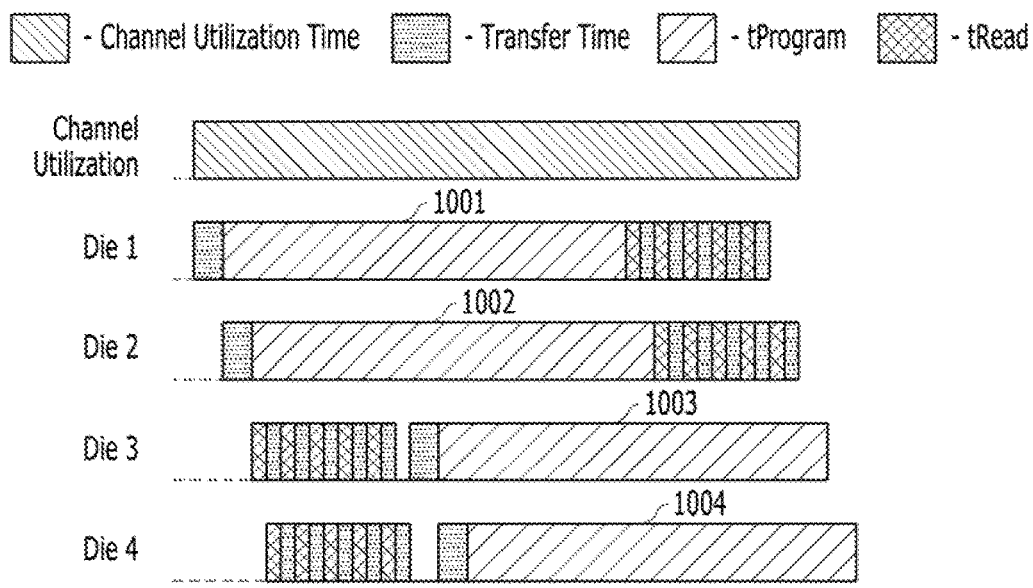

FIG. 6 is a flowchart illustrating the operation of the memory system 110 in accordance with the present embodiment, FIG. 7 is a table illustrating a background operation waiting list in accordance with the present embodiment, and FIGS. 8 to 10 are diagrams for illustrating the operation of the memory system 110 in accordance with the present embodiment.

FIGS. 6 to 10 illustrate how a program operation and background operation for a write command applied to the memory system 110 from the host 102 is processed in the memory system 110.

Referring to FIG. 6, at step S601, the controller 130 may receive a command and data from the host 102. For example, the command may include a write command W_CMD.

At step S603, the controller 130 may check whether a waiting internal read operation exists. The internal read operation may include a background operation. Hereafter, for convenience of description, the internal read operation will be referred to as the background operation. The reason that the controller 130 checks whether a waiting background operation exists is to determine whether to perform the background operation when the program operation is performed or whether to perform the background operation after the program operation is performed. For this operation, the controller 130 may check whether a waiting background operation exists, through the background operation waiting list as illustrated in FIG. 7. The background operation waiting list illustrates workloads when the controller 130 performs a garbage collection (GC) operation or a wear leveling (WL) operation, that is, background workloads. The GC operation may indicate an operation of copying data stored in memory blocks of the first to fourth memory devices 1501 to 1504 to a certain memory block. The WL operation may indicate an operation of swapping the memory blocks of the first to fourth memory devices 1501 to 1504 or data stored in the memory blocks. That is, the background operation waiting list illustrates waiting background workloads at a plurality of sections or periods for example, first to fourth sections for the plurality of dies corresponding to the respective ways of one channel in the memory devices. The background workload may indicate the number of waiting background operations which are performed according to the interleaving method, during an idle section of the channel which occurs during a program operation. The number of waiting background operations may be calculated according to an internal read operation performance time for performing the background operation.

When it is checked at step S603 that no waiting background operations exist in the background operation waiting list (N), the controller 130 may perform the background operations by sequentially performing program operations 801 to 804 corresponding to the respective dies Die1 to Die4 and then performing an internal read operation 811 to 814 corresponding to the internal read command as illustrated in FIG. 8, at step S605. Such an operation may be referred to as a normal operation.

Moreover, when it is checked at step S603 that a waiting background operation exists in the background operation waiting list (Y), the controller 130 may calculate a maximum background operation or internal read operation number $BG_{max}$ indicating a maximum number of background operations which can be performed through an interleaving operation during one program operation, at step S607. The maximum background operation number may indicate a maximum number of background operations which can be performed by any one die of the plurality of dies except the die in which the program operation is being performed, during an idle period of the channel which occurs in any one of the first to fourth dies during the program operation. The maximum background operation number may be calculated as follows. The controller 130 may calculate the maximum background operation number $BG_{max}$ at an idle period of the channel in the program operation, using the program period tProgram in which the memory device 150 performs a program operation, as a program operation parameter, and using the read period tRead in which the memory device 150 performs an internal read operation, as an internal read operation parameter. The maximum background operation number $BG_{max}$ may be expressed as Equation 1 below.

$$BG_{max} = \left(\frac{tProgram}{tRead}\right) \times \frac{1}{2} \quad (1)$$

For example, when the program period tProgram is 1500 µs and the read period tRead is 50 µs, the number of background operations which can be performed by the first to fourth dies 1501_1 to 1501_4 included in the first memory device 1501, except the die in which the internal read operation or the program operation is being performed, that is, the maximum back operation number is 15.

At step S609, the controller 130 may check a minimum background operation or internal read operation waiting number $BG_{min}$ indicating one or more background operations which can be performed in an interleaving manner during the program operation. The minimum background operation waiting number $BG_{min}$ may be checked through the background operation waiting list of FIG. 7. The reason to check the minimum background operation waiting number $BG_{min}$ is to check the magnitude relationship between the minimum background operation waiting number $BG_{min}$ and the maximum background operation number $BG_{max}$.

For example, the number of background operations which can be performed at the first section or period of the first memory device 1501 is as follows: the number of background operations which can be performed by the first die Die1 through the first way WAY1 of the first channel CH1 is 18, the number of background operations which can be performed by the second die Die2 through the second way WAY2 of the first channel CH1 is 24, the number of background operations which can be performed by the third die Die3 through the third way WAY3 of the first channel CH1 is 7, and the number of background operations which can be performed by the fourth die Die4 through the fourth way WAY4 of the first channel CH1 is 5. In this case, since the number of background operations which can be performed by the fourth die Die4 through the fourth way WAY4 of the first channel CH1 is the smallest value of 5, the minimum background operation waiting number $BG_{min}$ at the first section of the first memory device 1501 is 5.

Next, the number of background operations which can be performed at the first section of the second memory device 1502 is as follows: the number of background operations which can be performed by the first die Die1 through the first way WAY1 of the second channel CH2 is 50, the number of background operations which can be performed by the second die Die2 through the second way WAY2 of the second channel CH2 is 18, the number of background operations which can be performed by the third die Die3 through the third way WAY3 of the second channel CH2 is 20, and the number of background operations which can be performed by the fourth die Die4 through the fourth way WAY4 of the second channel CH2 is 40. In this case, since the number of background operations which can be performed by the second die through the second way WAY2 of the second channel CH2 is the smallest value of 18, the minimum background operation waiting number $BG_{min}$ at the first section of the second memory device 1502 is 18.

Next, the number of background operations which can be performed at the first section of the third memory device 1503 is as follows: the number of background operations which can be performed by the first die Die1 through the first way WAY1 of the third channel CH3 is 45, the number of background operations which can be performed by the second die Die2 through the second way WAY2 of the third channel CH3 is 45, the number of background operations which can be performed by the third die Die3 through the third way WAY3 of the third channel CH3 is 45, and the number of background operations which can be performed by the fourth die Die4 through the fourth way WAY4 of the third channel CH3 is 45. In this case, since the numbers of background operations which can be performed by the first to fourth dies through the first to fourth ways of the third channel CH3 are all 45, the minimum background operation waiting number $BG_{min}$ at the first section of the third memory device 1503 is 45.

Next, the number of background operations which can be performed at the first section of the fourth memory device 1504 is as follows: the number of background operations which can be performed by the first die Die1 through the first way WAY1 of the fourth channel CH4 is 0, the number of background operations which can be performed by the second die Die2 through the second way WAY2 of the fourth channel CH4 is 0, the number of background operations which can be performed by the third die Die3 through the third way WAY3 of the fourth channel CH4 is 0, and the number of background operations which can be performed by the fourth die Die4 through the fourth way WAY4 of the fourth channel CH4 is 0. In this case, since the numbers of background operations which can be performed by the first to fourth dies through the first to fourth ways of the fourth channel CH4 are all 0, the minimum background operation waiting number $BG_{min}$ at the first section of the fourth memory device 1504 is 0.

At step S611, the controller 130 may check whether the number of dies which can perform the program operation during the background operation in the interleaving manner is two or more, using the minimum background operation waiting number $BG_{min}$ that is, number of dies ≥2. For reference, the reason to check whether the number of dies is two or more is that the configuration in which one memory device includes four memory dies and two memory dies are operated in the interleaving manner was taken as an example. When a smaller or larger number of dies are included in one memory device and operated in the interleaving manner, the operation condition of step S611 may be changed.

When it is checked at step S611 that the number of dies which can perform the program operation during the background operation in the interleaving manner is less than two (N), the controller 130 may sequentially perform program operations corresponding to the respective dies and then perform the background operation as illustrated in FIG. 8, at step S605.

Moreover, when the number of dies which can perform the program operation during the background operation in the interleaving manner is equal to or more than two (Y), the controller 130 may compare the minimum background operation waiting number $BG_{min}$ to the maximum background operation number $BG_{max}$ at step S613.

When it is checked at step S613 that the minimum background operation waiting number $BG_{min}$ is greater than the maximum background operation number $BG_{max}$ that is, the minimum background operation waiting number $BG_{min}$>maximum background operation number $BG_{max}$ (Y), any one die of the first to fourth dies except the die in which a program operation is performed may perform as many background operations as the maximum background operation number $BG_{max}$ while the program operation is performed, at step S615.

Referring to FIGS. 7 and 9, while first and second program operations 901 and 902 are performed in the first and second dies Die1 and Die2 which sequentially receive first and second write commands through the first and second ways of the third channel CH3 at the first section, the third and fourth dies Die3 and Die4 may perform as many background operations as the maximum background operation number $BG_{max}$ through the third and fourth ways of the third channel CH3, using an idle period of the third channel. That is, the third die Die3 of the third channel CH3 may perform as many first background operations as the maximum background operation number $BG_{max}$, and the fourth die Die4 of the third channel CH3 may perform as many second background operations as the maximum background operation number $BG_{max}$.

Specifically, the minimum background operation waiting number $BG_{min}$ of the third channel CH3 at the first section is 45, and the maximum background operation number $BG_{max}$ is 15. Furthermore, the number of background operations which can be performed by the third die Die3 of the third channel CH3 is 45. Therefore, the third die Die3 of the third channel CH3 may perform 15 first background operations corresponding to the maximum background operation number $BG_{max}$. As a result, the number of background operations which can be performed by the third die Die3 of the third channel CH3 may decrease to 30. Similarly, the number of background operations which can be performed by the fourth die Die4 of the third channel CH3 is 45. Therefore, the fourth die Die4 of the third channel CH3 may perform 15 first background operations corresponding to the maximum background operation number $BG_{max}$. As a result, the number of background operations which can be performed by the fourth die Die4 of the third channel CH3 may decrease to 30.

Furthermore, while third and fourth program operations 903 and 904 are performed in the third and fourth dies Die3 and Die4 which sequentially receive third and fourth write commands through the third and fourth ways WAY3 and WAY4 of the third channel CH3 at the first section, the first and second dies Die1 and Die2 may perform as many background operations as the maximum background operation number $BG_{max}$ through the first and second ways WAY1 and WAY2 of the third channel CH3, using an idle period of the third channel CH3. That is, the first die Die1 of the third channel CH3 may perform as many third background operations as the maximum background operation number $BG_{max}$, and the second die Die2 of the third channel CH3 may perform as many fourth background operations as the maximum background operation number $BG_{max}$.

Specifically, the minimum background operation waiting number $BG_{min}$ of the third channel CH3 at the first section is 45, and the maximum background operation number $BG_{max}$ is 15. Furthermore, the number of background operations which can be performed by the first die Die1 of the third channel CH3 is 45. Therefore, the first die Die1 of the third channel CH3 may perform 15 first background operations corresponding to the maximum background operation number $BG_{max}$. As a result, the number of background operations which can be performed by the first die Die1 of the third channel CH3 may decrease to 30. Similarly, the number of background operations which can be performed by the second die Die2 of the third channel CH3 is 45. Therefore, the second die Die2 of the third channel CH3 may perform 15 first background operations corresponding to the maximum background operation number $BG_{max}$. As a result, the number of background operations which can be performed by the second die Die2 of the third channel CH3 may decrease to 30.

When it is checked at step S613 that the minimum background operation waiting number $BG_{min}$ is less than the maximum background operation number $BG_{max}$ that is, minimum background operation waiting number $BG_{min}$<maximum background operation number $BG_{max}$ (N), any one die of the first to fourth dies except the die in which the program operation is performed may perform as many background operations as the minimum background operation waiting number $BG_{min}$ while the program operation is performed, at step S617.

Referring to FIGS. 7 and 10, while first and second program operations 1001 and 1002 are performed in the first and second dies Die1 and Die2 which sequentially receive first and second write commands through the first and second ways WAY1 and WAY2 of the first channel CH1 at the first section, the third and fourth dies Die3 and Die4 may perform as many background operations as the minimum background operation waiting number $BG_{min}$ using the third and fourth ways WAY3 and WAY4 of the first channel CH3. That is, the third die Die3 may perform as many first background operations as the minimum background operation waiting number $BG_{min}$, and the fourth die Die4 may perform as many second background operations as the minimum background operation waiting number $BG_{min}$.

Specifically, the minimum background operation waiting number $BG_{min}$ of the first channel CH1 at the first section is 5, and the maximum background operation number $BG_{max}$ is 15. Furthermore, the number of background operations which can be performed by the third die Die3 of the first channel CH1 is 7. Therefore, the third die Die3 of the first channel CH1 may perform as many first background operations as the minimum background operation waiting number $BG_{min}$. As a result, the number of background operations which can be performed by the third die Die3 of the first channel CH1 may decrease to 2. Similarly, the number of background operations which can be performed by the fourth die Die4 of the first channel CH1 is 5. Therefore, the fourth die Die4 of the first channel CH1 may perform as many first background operations as the minimum background operation waiting number $BG_{min}$. As a result, the number of background operations which can be performed by the fourth die Die4 of the first channel CH1 may decrease to 0.

Furthermore, while third and fourth program operations 1003 and 1004 are performed in the third and fourth dies Die3 and Die4 which sequentially receive third and fourth write commands through the third and fourth ways WAY3 and WAY4 of the first channel CH1 at the first section, the first and second dies Die1 and Die2 may perform as many background operations as the minimum background operation waiting number $BG_{min}$ using the first and second ways WAY1 and WAY2 of the first channel CH1. That is, the first die Die1 may perform as many first background operations as the minimum background operation waiting number $BG_{min}$, and the second die Die2 may perform as many second background operations as the minimum background operation waiting number $BG_{min}$.

Specifically, the minimum background operation waiting number $BG_{min}$ of the first channel CH1 at the first section is 5, and the maximum background operation number $BG_{max}$ is 15. Furthermore, the number of background operations which can be performed by the first die Die1 of the first channel CH1 is 18. Therefore, the first die Die1 of the first channel CH1 may perform as many first background operations as the minimum background operation waiting number $BG_{min}$. As a result, the number of background operations which can be performed by the first die Die1 of the first channel CH1 may decrease to 13. Similarly, the number of background operations which can be performed by the second die Die2 of the first channel CH1 is 24. Therefore, the second die Die2 of the first channel CH1 may perform as many first background operations as the minimum background operation waiting number $BG_{min}$. As a result, the number of background operations which can be performed by the second die Die2 of the first channel CH1 may decrease to 19.

Figure 11:
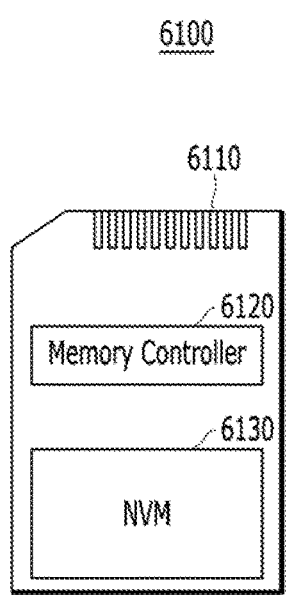
FIGS. 11 to 16 are diagrams illustrating examples of memory systems in accordance with embodiments.

FIG. 11 is a diagram illustrating a data processing system including the memory system according to the embodiment. FIG. 11 is a drawing schematically illustrating a memory card system to which the memory system according to an embodiment is applied.

Referring to FIG. 11, a memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, For example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 12:
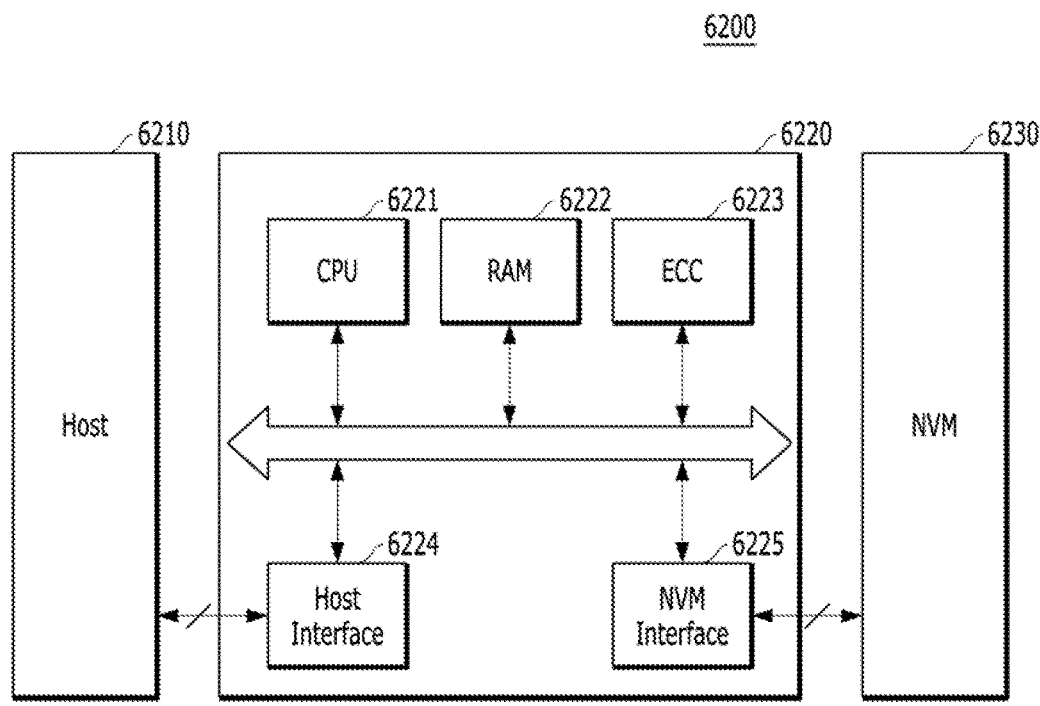

FIG. 12 is a diagram schematically illustrating an example of a data processing system including a memory system according to an embodiment of the present invention.

Referring to FIG. 12, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 13:
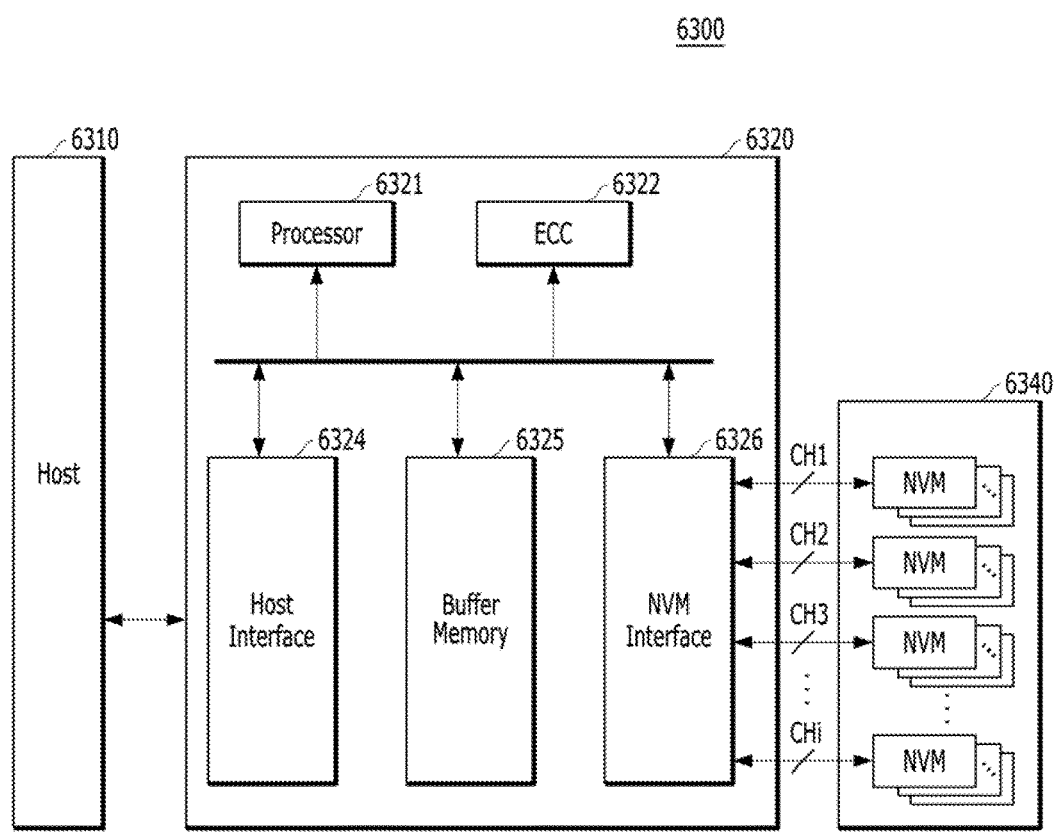

FIG. 13 is a diagram illustrating an example of a data processing system including a memory system according to an embodiment of the invention. FIG. 13 may be a solid state drive (SSD).

Referring to FIG. 13, an SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHl. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 13, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1, CH2, CH3, . . . and CHl.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 14:
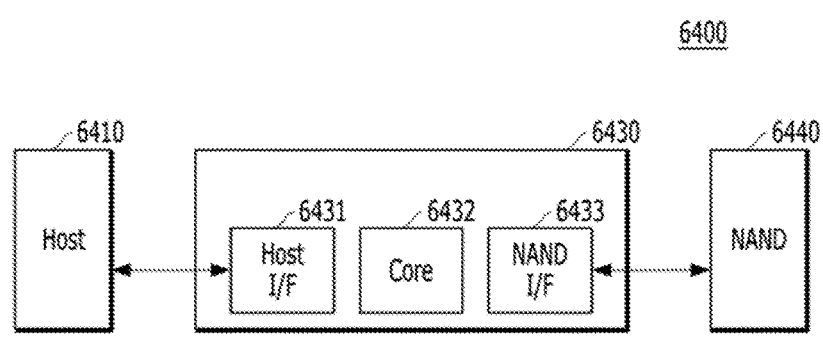

FIG. 14 is a diagram illustrating another example of a data processing system including the memory system according to an embodiment of the present invention. FIG. 14 is a drawing schematically illustrating an embedded multimedia card (eMMC) to which a memory system according to an embodiment is applied.

Referring to FIG. 14, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 15:
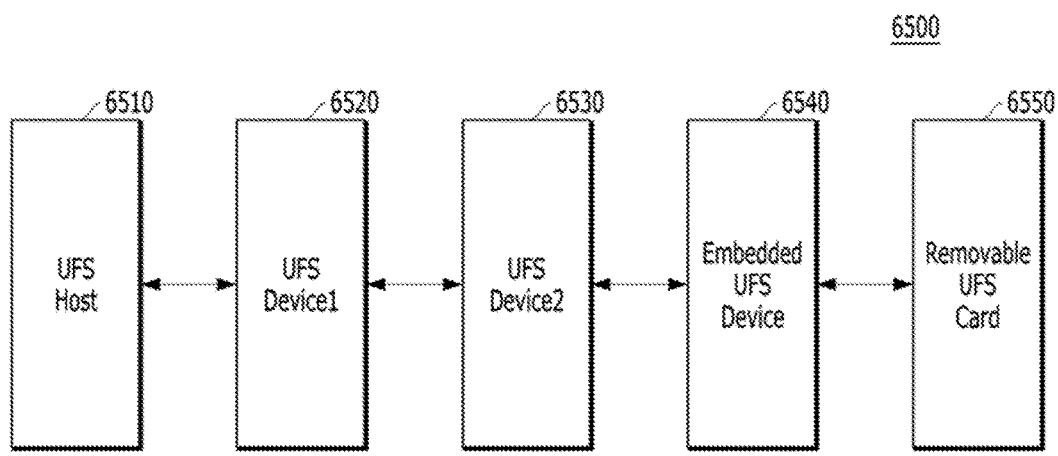

FIG. 15 is a diagram illustrating another example of a data processing system including a memory system according to an embodiment of the present invention. FIG. 14 is a drawing schematically illustrating a universal flash storage (UFS) to which the memory system according to the embodiment is applied.

Referring to FIG. 15, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 11. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 16:
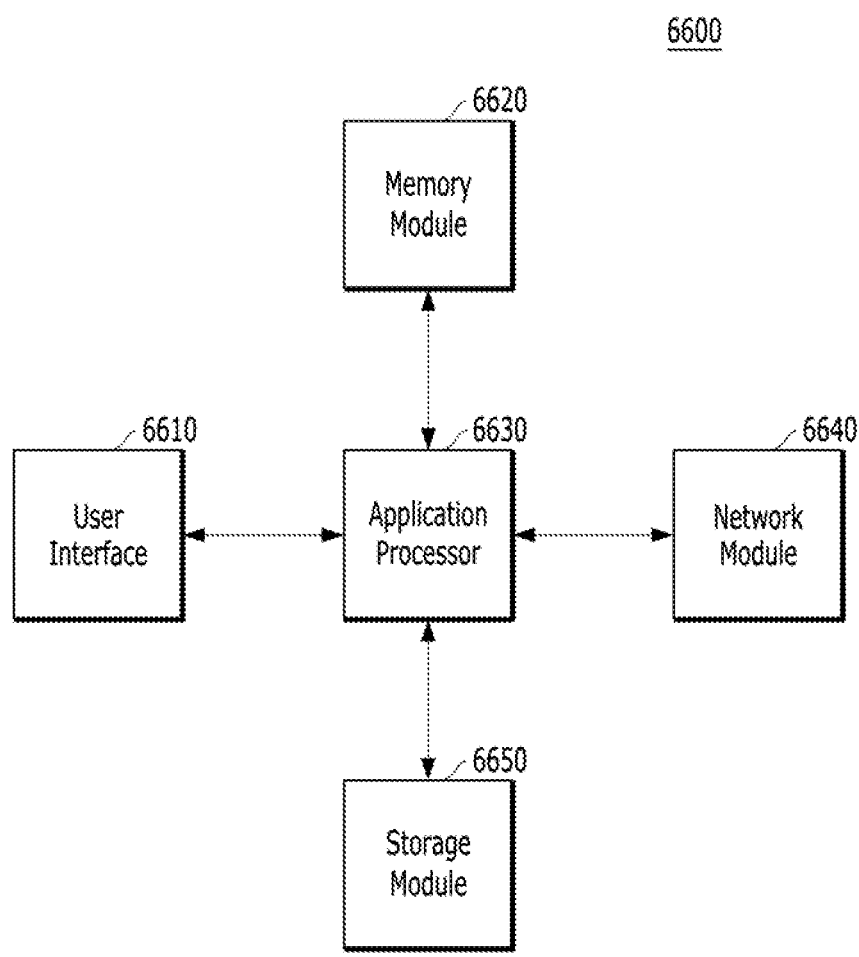

FIG. 16 is a diagram illustrating an example of a data processing system including the memory system according to an embodiment of the present invention. FIG. 16 is a drawing schematically illustrating a user system to which the memory system according to the embodiment is applied.

Referring to FIG. 16, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WIMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 13 to 15.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

In accordance with the present embodiments, the memory system and the operating method thereof can perform a background operation during an idle period of a channel, which occurs during a program operation, or perform the program operation and the background operation in the interleaving manner, thereby reducing the idle period of the channel. Therefore, the data processing operation time of the memory system can be reduced.

Although various embodiments have been described for illustrative purposes, it will be apparent to those skilled in the art that various changes and modifications may be made without departing from the spirit and scope of the invention as defined in the following claims.

What is claimed is:

1. An operation method for a memory system, comprising:
  accessing a plurality of memory devices, each including a plurality of dies, in an interleaving manner, and performing program operations; and
  performing at least one internal read operation to read data from the plurality of dies accessed in the interleaving manner, during the program operations,
  wherein one or more internal read operations which are performed during any one program operation of the program operations are determined according to a maximum internal read operation number and a minimum internal read operation waiting number,
  wherein the one or more internal read operations which are performed during any one of the program operations are determined through an operation of comparing a magnitude between the maximum internal read operation number and the minimum internal read operation waiting number.

2. The operation method of claim 1, further comprising:
  before the one or more internal read operations are performed during the one program operation, determining whether waiting internal read operations exist through an internal read operation waiting list, and
  wherein, when it is determined that the waiting internal read operations exist, the program operation and the internal read operation are performed in the interleaving manner.

3. The operation method of claim 1, wherein the plurality of memory devices or the plurality of dies included in each of the memory devices are coupled to a plurality of ways coupled to one channel or a plurality of channels.

4. The operation method of claim 1, wherein the internal read operation comprises a background operation, and the background operation comprises one of a garbage collection operation and a wear leveling operation.

5. The operation method of claim 1, wherein the minimum internal read operation waiting number indicates a minimum number of internal read operations which can be performed in an internal read operation waiting list including a number of waiting internal read operations which can be performed by the plurality of memory devices or the plurality of dies.

6. The operation method of claim 5, wherein the internal read operation waiting number included in the internal read operation waiting list is determined according to an internal read operation performance time.

7. The operation method of claim 1, wherein the maximum internal read operation number indicates a maximum number of internal read operations which can be performed during any one of the program operations.

8. The operation method of claim 1, wherein in the comparing of the magnitude between the maximum internal read operation number and the minimum internal read operation waiting number,
when the minimum internal read operation waiting number is less than the maximum internal read operation number, as many internal read operations as the minimum internal read operation waiting number are performed during the program operation.

9. The operation method of claim 1, wherein in the comparing of the magnitude between the maximum internal read operation number and the minimum internal read operation waiting number,
when the minimum internal read operation waiting number is greater than the maximum internal read operation number, as many internal read operations as the maximum internal read operation number are performed during the program operation.

10. A memory system comprising:
a plurality of memory devices, each including a plurality of dies; and
a controller configured to access the plurality of memory devices in an interleaving manner, perform data input operations or data output operations corresponding to the respective memory devices, and perform at least one internal read operation to read data from the plurality of dies accessed in the interleaving manner, during the program operations,
wherein the controller determines the number of one or more internal read operations which are performed during any one program operation of the program operations according to a maximum internal read operation number and a minimum internal read operation waiting number,
wherein the one or more internal read operations which are performed during any one of the program operations comprises comparing a magnitude between the maximum internal read operation number and the minimum internal read operation waiting number.

11. The memory system of claim 10, wherein before the one or more internal read operations are performed during the one program operation, the controller is further configured to determine whether waiting internal read operations exist, through an internal read operation waiting list, and performs the program operation and the internal read operation in the plurality of memory devices according to the interleaving manner, when it is determined that the waiting internal read operations exist.

12. The memory system of claim 10, wherein the controller is coupled to the plurality of memory devices or the plurality of dies included in each of the memory devices through a plurality of ways coupled to one channel or a plurality of channels.

13. The memory system of claim 10, wherein the internal read operation comprises a background operation, and the background operation comprises one of a garbage collection operation and a wear leveling operation.

14. The memory system of claim 10, wherein the controller determines the minimum internal read operation waiting number indicating a minimum number of internal read operations which can be performed in the internal read operation waiting list including number of waiting internal read operations which can be performed in the plurality of memory devices or the plurality of dies.

15. The memory system of claim 14, wherein the controller determines the internal read operation waiting number included in the internal read operation waiting list, based on an internal read operation performance time.

16. The memory system of claim 10, wherein the maximum internal read operation number indicates a maximum number of internal read operations which can be performed during any one of the program operations.

17. The memory system of claim 10, wherein when the minimum internal read operation waiting number is less than the maximum internal read operation number according to the result of the checking of the magnitude relationship between maximum internal read operation number, the controller performs as many internal read operations as the minimum internal read operation waiting number during the program operation.

18. The memory system of claim 10, wherein when the minimum internal read operation waiting number is greater than the maximum internal read operation number as the result of the comparing of the magnitude between maximum internal read operation number and the minimum internal read operation waiting number, the controller performs as many internal read operations as the maximum internal read operation number during the program operation.

\* \* \* \* \*